United States Patent
Saib et al.

(10) Patent No.: US 10,295,912 B2
(45) Date of Patent: May 21, 2019

(54) METHOD FOR DETERMINING THE PARAMETERS OF AN IC MANUFACTURING PROCESS MODEL

(71) Applicant: ASELTA NANOGRAPHICS, Grenoble (FR)

(72) Inventors: Mohamed Saib, Saint Martin D'Heres (FR); Patrick Schiavone, Villard-Bonnot (FR); Thiago Figueiro, Grenoble (FR)

(73) Assignee: ASELTA NANOGRAPHICS, Grenoble (FR)

( * ) Notice: Subject to any disclaimer, the term of this patent is extended or adjusted under 35 U.S.C. 154(b) by 33 days.

(21) Appl. No.: 15/327,330

(22) PCT Filed: Jul. 30, 2015

(86) PCT No.: PCT/EP2015/067535
§ 371 (c)(1),
(2) Date: Jan. 18, 2017

(87) PCT Pub. No.: WO2016/020264
PCT Pub. Date: Feb. 11, 2016

(65) Prior Publication Data
US 2017/0168401 A1    Jun. 15, 2017

(30) Foreign Application Priority Data

Aug. 5, 2014   (EP) .................................... 14306241

(51) Int. Cl.
*G03F 7/20*    (2006.01)
*G03F 1/36*    (2012.01)
(Continued)

(52) U.S. Cl.
CPC ............ *G03F 7/70441* (2013.01); *G03F 1/26* (2013.01); *G03F 1/36* (2013.01); *H01J 37/3026* (2013.01);
(Continued)

(58) Field of Classification Search
USPC ......................................................... 716/53
See application file for complete search history.

(56) References Cited

U.S. PATENT DOCUMENTS

| 2006/0075378 A1 | 4/2006 | Beale et al. |
| 2007/0101310 A1* | 5/2007 | Stirniman ................. G03F 1/36 716/53 |

(Continued)

FOREIGN PATENT DOCUMENTS

| EP | 2 560 187 A1 | 2/2013 |
| EP | 2 650 902 A2 | 10/2013 |

(Continued)

*Primary Examiner* — Bryce M Aisaka
(74) *Attorney, Agent, or Firm* — Baker & Hostetler LLP

(57) ABSTRACT

An IC manufacturing model is disclosed, wherein input variables and an output variable are measured using a calibration set of patterns. The model can or cannot include a PSF. The output variable may be a dimensional bias between printed patterns and target patterns or simulated patterns. It can also be a Threshold To Meet Experiments. The input variables may be defined by a metric which uses kernel functions, preferably with a deformation function which includes a shift angle and a convolution procedure. A functional or associative relationship between the input variables and the output variable is defined. Preferably this definition includes normalization steps and interpolation steps. Advantageously, the interpolation step is of the kriging type. The invention achieves a much more accurate modeling of IC manufacturing, simulation or inspection processes.

15 Claims, 8 Drawing Sheets

(51) Int. Cl.
*H01J 37/317* (2006.01)
*H01J 37/302* (2006.01)
*G03F 1/26* (2012.01)

(52) U.S. Cl.
CPC . *H01J 37/3174* (2013.01); *H01J 2237/31769* (2013.01); *H01J 2237/31796* (2013.01)

(56) References Cited

U.S. PATENT DOCUMENTS

| | | |
|---|---|---|
| 2010/0269084 A1 | 10/2010 | Granik |
| 2011/0138343 A1 | 6/2011 | Granik |
| 2012/0221982 A1 | 8/2012 | Jeong et al. |
| 2017/0116462 A1* | 4/2017 | Ogasawara ........ G06K 9/00201 |

FOREIGN PATENT DOCUMENTS

| | | |
|---|---|---|
| EP | 2 952 963 A1 | 12/2015 |
| WO | 2013/037788 A1 | 3/2013 |

* cited by examiner

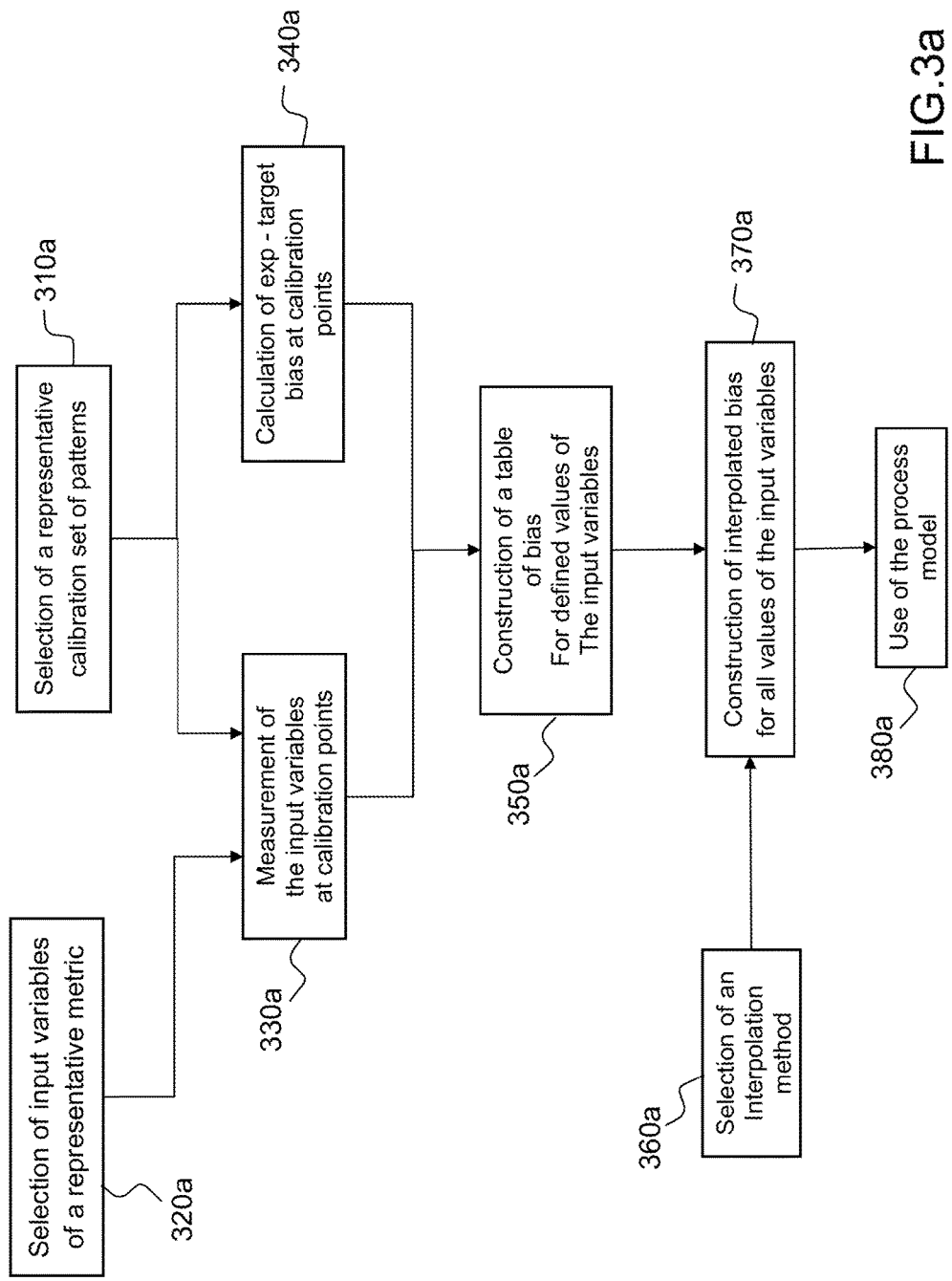

| Variable1 | Variable2 | Variable3 | TTME |
|---|---|---|---|
| 0 | 0 | 0 | 6.6 |
| 0 | 0 | 0.3 | 6.58 |
| 0 | 0.5 | 0 | 6.64 |
| 0 | 0.5 | 0.3 | 6.7 |
| 0.9 | 0 | 0 | 6.7 |
| 0.9 | 0 | 0.3 | 6.7 |
| 0.9 | 0.5 | 0 | 6.87 |
| 0.9 | 0.5 | 0.3 | 6.80 |

FIG.4a

| Variable1 | Variable2 | Variable3 | Bias |
|---|---|---|---|
| 0 | 0 | 0 | -0.7 |
| 0 | 0 | 0.3 | -3.5 |
| 0 | 0.5 | 0 | 0.7 |
| 0 | 0.5 | 0.3 | 2.8 |
| 0.9 | 0 | 0 | 3.5 |
| 0.9 | 0 | 0.3 | -3.5 |
| 0.9 | 0.5 | 0 | 1.4 |
| 0.9 | 0.5 | 0.3 | 0.7 |

FIG.4b

METHOD FOR DETERMINING THE PARAMETERS OF AN IC MANUFACTURING PROCESS MODEL

CROSS-REFERENCE TO RELATED APPLICATIONS

This application is a National Stage of International patent application PCT/EP2015/067535, filed on Jul. 30, 2015, which claims priority to foreign European patent application No. EP 14306241.2, filed on Aug. 5, 2014, the disclosures of which are incorporated by reference in their entirety.

FIELD OF THE INVENTION

The present invention notably applies to the field of electronic or optical lithography. It applies, among other processes, to mask write and direct write. It can also apply to other steps of semiconductor manufacturing processes, such as nanoimprint, DSA (Directed Self Assembly), etching, CMP (Chemical Mechanical Polishing/Planarization), annealing, baking, metrology, etc. . . . .

BACKGROUND

During the process of mask write or direct write, several factors contribute to induce errors and prevent the achievement of the expected pattern fidelity. Some of these factors are the electron scattering (forward and backward), resist diffusion, resist thickness, etching, flare, fogging, metrology, heating, etc. In order to improve the resolution and reduce the impact of these phenomena, there are several strategies of proximity effect correction (PEC), fogging effect correction (FEC), etching compensation, among others. The strategies are based on a prediction of the impact of each effect followed by a correction of these by means of dose and/or geometry compensation. Therefore, the quality of the correction depends upon the quality of the models used to predict the phenomena, said models being different from one manufacturing process to another. High accuracy of the model and of the corrections can certainly be obtained, but at a high computation cost.

It has become common knowledge to use a decomposition of the model into two models, a first one to predict the electronic proximity effects, and a second one to predict all the other effects, often called resist model.

In the art, prediction of the electronic proximity effects is carried out using one or more Point Spread Function (PSF) of different types (Gaussian or other) which are convoluted with the target design to give an aerial image at the resist level.

The parameters of the resist model have also to be calculated from the characteristics of the target design, so that the model accurately represents the threshold for the various pattern configurations in the design. The resist model should be capable, at the same, of correcting the imperfections of the electronic model and of representing the impact of the other steps of the manufacturing process, notably the effects of the exposure process as well as the resist development.

A plurality of models have been disclosed and used, to define an adequate resist model, notably:

Type I models: they are characterized by a constant energy threshold, wherein the constant energy threshold is deemed to define a level of energy above which the interaction of the beam with the resist reveals the pattern (in the case of negative resists);

Type II models: they are characterized by a combination of a constant energy threshold, defined as above, with a variable bias which is defined on the contours of each sub-part of the target design as a polynomial function of the local, semi-global or global properties of the aerial image; examples of these Type II models are disclosed by Dunn et alii, (2009) "Etch Aware Optical Proximity Correction: A First Step Toward Integrated Pattern Engineering", Optical Microlithography XXII, proc. SPIE vol 7274; Q. Liu et alii (2010). "Study of Model based etch bias retarget for OPC", Optical Microlithography) (XII, proc SPIE vol 7640; J.-G. Park et alii (2011), 'The effective etch process proximity correction methodology for improving on chip CD variation in 20 nm node DRAM gate', Design for Manufacturability though Design-Process Integration V, proc. SPIE vol 7974; in the models of these Type II, the parameters which are taken into account to compute the bias are the size of the design, the space between parts of the design or the density of the design;

Type III models: these models correspond to another formulation, based on a variable energy threshold using parameters and functions of the same type as the Type II models; a disclosure of this Type III models can be found in "Cobb, N. B.; Zakhor, A.; Reihani, M.; Jahansooz, F. & Raghavan, V. N. Experimental results on optical proximity correction with variable-threshold resist model Proc. SPIE, 1997, 3051, 458-46" Models of Type I have been found not to be accurate enough, especially for some critical patterns, because a constant energy threshold does not represent all the physical effects on the target surface.

Models of Type II and Type III have been demonstrated by experimental use by the applicant as not working in a generality of cases. This is because a polynomial representation may not cover all experimental behaviors. Although the variables which are selected work accurately enough for some parts of the design patterns, they may not work for others, where they do no bring any improvement to the representation of the physical properties and may also lead to worsening the scenario. Also, it might be interesting in some situations to use one model instead of two different models to represent the electronic effects and the process effects, such a combination being time consuming.

SUMMARY OF THE INVENTION

The invention overcomes the aforementioned problems of the prior art by providing a single model which is not defined a priori as being polynomial—or any predefined function—but is designed by a calibration procedure. The proposed model may be used to represent all the electronic, physical, mechanical or chemical phenomena which take place in the IC manufacturing process, notably lithography, resist, etching, loading, etc.

To this effect, the invention discloses a method of determining, with a computer, a model of a process for manufacturing a semiconductor integrated circuit defined by a target design to be printed on a substrate, said method being characterized in that it comprises: selecting a calibration set comprising a plurality of patterns; selecting at least an input variable representative of a variance in features of said plurality of patterns; acquiring a series of values of the at least an input variable by determining a first series of values of the at least an input variable at a number of points on the plurality of patterns; calculating, at the number of points, a second series of values of an output variable representative of a print of patterns of the calibration set; determining the process model as being one of a functional and associative relationship between the first series of values of the at least an input variable and the second series of values of the output variable.

Advantageously, said relationship is extended to the target design by an interpolation procedure.

Advantageously, the at least an input variable is representative of one of CD, Space and density of patterns in the target design.

Advantageously, the at least an input variable is determined by convoluting a compound of a kernel function and a deformation function with the target design, said deformation function comprising a selected shift angle.

Advantageously, the number of points on the plurality of patterns are located on the edges of said patterns.

The method of one of claims 1 to 5, wherein the output variable is a dimensional bias between target patterns in the calibration set and the actual printed patterns.

Advantageously, the output variable is a dimensional bias between the actual printed patterns in the calibration set and the aerial image of a simulated design obtained by convolution of the target patterns in the calibration set with a PSF.

Advantageously, the output variable is a Threshold To Meet Experiments (TTME) representative of a received dose defined by a PSF to create an aerial image of patterns in the calibration set.

Advantageously, the TTME is determined at one of after exposure and after etching.

Advantageously, series of values of the output variables obtained for same values of the at least an input variable are merged by a weighted average procedure.

Advantageously, the interpolation procedure is a kriging procedure.

Advantageously, the kriging procedure has a step which is defined as a function of the tolerance of the corrections to be applied to the target design.

The invention further discloses a method of using a model of a process for manufacturing a semiconductor integrated circuit defined by a target design to be printed on a substrate, said method being characterized in that it comprises: selecting in a memory of a computer a process model in a list of candidate process models based on a list of features characterizing at least one of the target design, the resist and the substrate; retrieving from the memory of the computer one of a functional and associative relationship between values of at least an input variable and values of an output variable characterizing the selected process model; calculating values of the at least an input variable at loci on the target design; getting from the model values of the output variable for the at least an input variable at the loci; storing the values of the output variable at the loci for use in one of a correction step, a simulation step and an inspection step of the IC manufacturing process.

The invention further discloses a computer program for determining a model of a process for manufacturing a semiconductor integrated circuit defined by a target design, said computer program being characterized in that it comprises: one or more interfaces for: i) selecting a calibration set comprising a plurality of patterns; ii) selecting at least an input variable representative of a variance in features of said plurality of patterns; iii) acquiring a first series of values of the at least an input variable by determining the at least an input variable at a number of points on the plurality of patterns; computer code configured for calculating, at the number of points, a series of values of an output variable representative of a print of patterns of the calibration set; computer code configured for determining the process model as being one of a functional and associative relationship between the series of values of the at least an input variable and the output variable.

The invention further discloses a computer program for using a model of a process for manufacturing a semiconductor integrated circuit defined by a target design to be printed on a substrate, said computer program being characterized in that it comprises: one or more interfaces for: selecting in a memory of a computer a process model in a list of candidate process models based on a list of features characterizing at least one of the target design, the resist and the substrate; retrieving from the memory of the computer one of a functional and associative relationship between values of at least an input variable and values of an output variable characterizing the selected process model; computer code configured for: calculating values of the at least an input variable at loci on the target design; getting from the model values of the output variable for the at least an input variable at the loci; storing the values of the output variable at the loci for use in one of a correction step, a simulation step and an inspection step of the IC manufacturing process.

The invention further discloses a semiconductor manufacturing equipment configured to use at least an output of a computer program according to the invention, said semiconductor manufacturing equipment configured for one of direct writing on semiconductor wafers, writing on a mask plate, etching, chemically or mechanically planarizing, or baking, annealing a semiconductor wafer, and inspecting a mask or semiconductor surface.

Another advantage of the invention is that it is not limited to polynomial fit (linear or quadratic) of the manufacturing process. Also, a calibration process according to the invention can be supplemented by an interpolation/extrapolation process to more accurately represent the variations of the design patterns across its entire surface. Notably, the use of different metrics or process responses as input to kernel functions, allows the inclusion in the process model of a large number of parameters of different types, in the dose or geometry domains, which yields a much better representation of the physical reality.

BRIEF DESCRIPTION OF THE DRAWINGS

The invention will be better understood and its various features and advantages will become apparent from the description of various embodiments and of the following appended figures:

FIGS. 3a, 3b and 3c represent flow charts of variants of the process to build a process model according to a number of embodiments of the invention;

FIGS. 4a and 4b represent tables with variables of a process model and corresponding values respectively of the TTME and the bias in a number of embodiments of the invention;

DETAILED DESCRIPTION

Figure 1A:
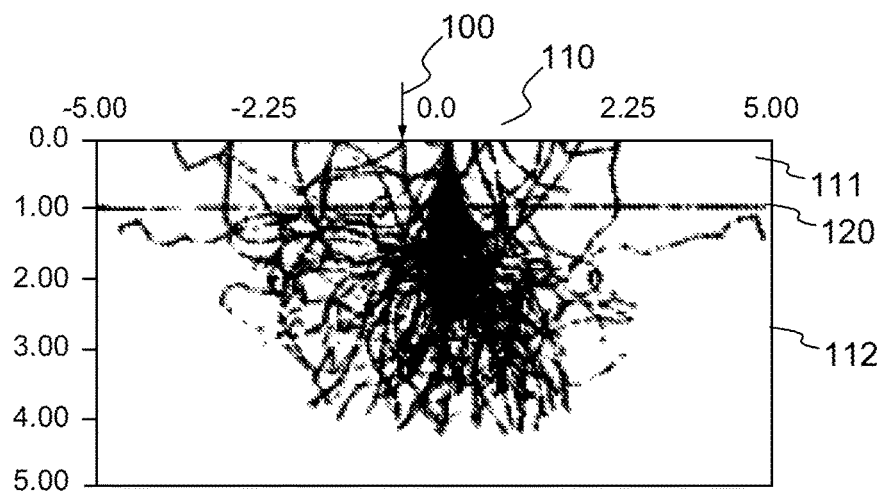
FIGS. 1a and 1b represent the backscattering effect of the particles directed at a substrate with a resist.
Figure 1B:
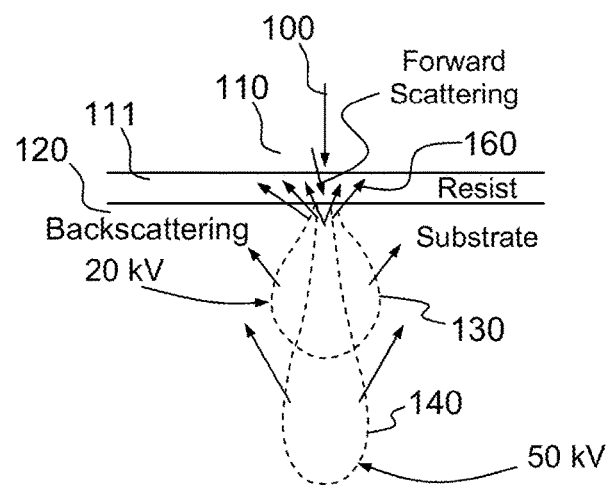

FIGS. 1a and 1b represent the backscattering effect of the particles directed at a substrate with a resist.

FIG. 1a shows a vertical cross section of the trajectories of the electrons of the beam in the target 110 (layer of resist 111 then in the substrate 112 delimited by the line 120). The random nature of the trajectories, which lends itself well to a modeling by Monte-Carlo simulation, can be observed. However, a simulation of this type is difficult to use in production because it does not allow for direct calculation with parameterized or tabulated functions.

In FIG. 1b, the two scattering effects resulting from the interactions of the electronic beam 100 with the target 110 have been modeled. Two scattering clouds 130, 140 are represented which correspond to acceleration voltages of 20 kV and 50 kV. The forward scattering is represented by the arrow 150 and the backscattering by the arrows 160. As can be seen, the higher the acceleration voltage, the deeper the cloud but the smaller the aperture of this cloud. The backscattered electrons will be ejected on the surface of the target at a greater distance from the point of impact of the center of the beam if the voltage is high.

The electronic proximity effects depend notably on the materials of the target and on its geometry. Whatever the reason for wanting to perform this electronic bombardment (etching, imaging or analysis), it is therefore necessary to take account of the proximity effects in order to obtain a result which is true to the desired objective. This is the object of a specific modeling, separate from the modeling of the other physical or chemical effects.

For this, it is known practice to use a so-called scattering or point spread function (PSF) and a convolution of the PSF with the geometry of the target is performed. A PSF that is commonly used is a combination of Gaussians, a first Gaussian to model the forward scattering (PSF of the forward scattering), and one or more additional Gaussians to model the backscattering (PSF of the backscattering).

The PSF equation is thus conventionally represented by a function f(x,y) of the following form:

$$f(\xi) = \frac{1}{\pi(1+\eta)} \left( \frac{1}{\alpha^2} e^{\frac{-\xi^2}{\alpha^2}} + \frac{\eta}{\beta^2} e^{\frac{-\xi^2}{\beta^2}} \right)$$

With the following notations:
α is the width of the direct radiation;
β is the backscattering width;
η is the ratio of the intensities of the direct and backscattered radiations;
ξ is the radial position of a point.

The values of the parameters α, β and η can be determined by trial and error for a given process. These parameters are a function of the acceleration voltage of the machine and of the target. Typically, for an acceleration voltage of the order of 50 KV and a silicon or glass target ($SiO_2$), α is of the order of 30 nm, β of the order of 10 μm and η of the order of 0.5.

The efficiency of this model is, however, not good, notably for the distant effects which are dominated by the backscattering.

Some improvements to the PSF approach have been proposed and implemented, notably in European patent application published under no EP2560187 which is co-assigned to the applicant of the present application, wherein a Gaussian function which is off-centered in relation to the center of the beam is used to represent the backscattering effect.

But the goal of the modeling approach is to be able to represent an actual manufacturing process, what is important is the actual output of all manufacturing steps, i.e. the actual print of the mask or wafer in case of direct write, not only the aerial image which is approximated by the PSF convoluted with the design patterns. Therefore, in some embodiments of the present invention, the inventors have bypassed the traditional approach which is to segment the modeling of the process in two models, i.e. a PSF model and a resist model. In this case, the model calibration based on the measurements of a set of specific patterns allows full parameterization of a joint model. In some other embodiments, a PSF is selected as a function of the application (for instance as a function of the materials where the target design is to be implanted), and a process model according to the invention is used to parameterize the other spatial, physical, mechanical and chemical effects of the IC semiconductor manufacturing process.

Figure 2A:
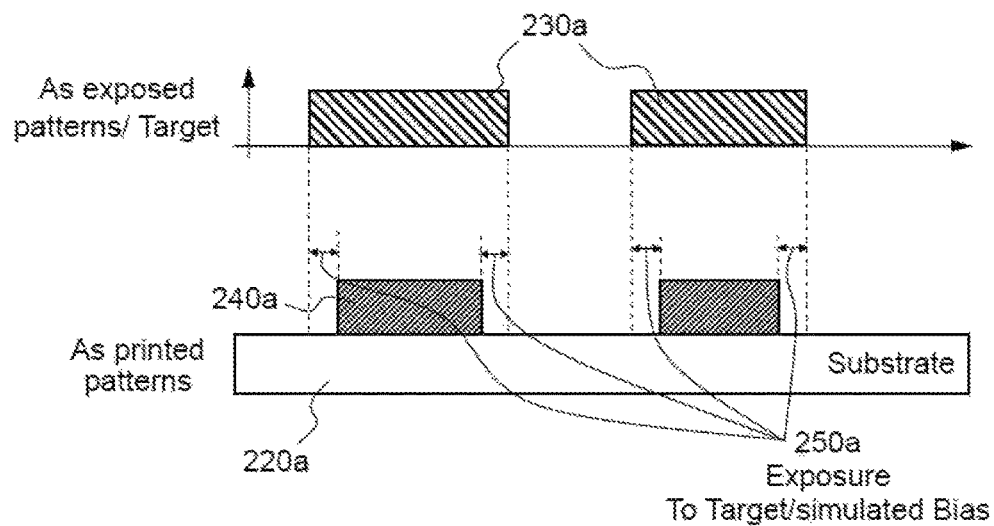
FIGS. 2a and 2b illustrate respectively a bias between the target/simulated patterns and the measured patterns, and a relationship between the measured pattern and Threshold To Meet Experiment (TTME) in a number of embodiments of the invention.
Figure 2B:
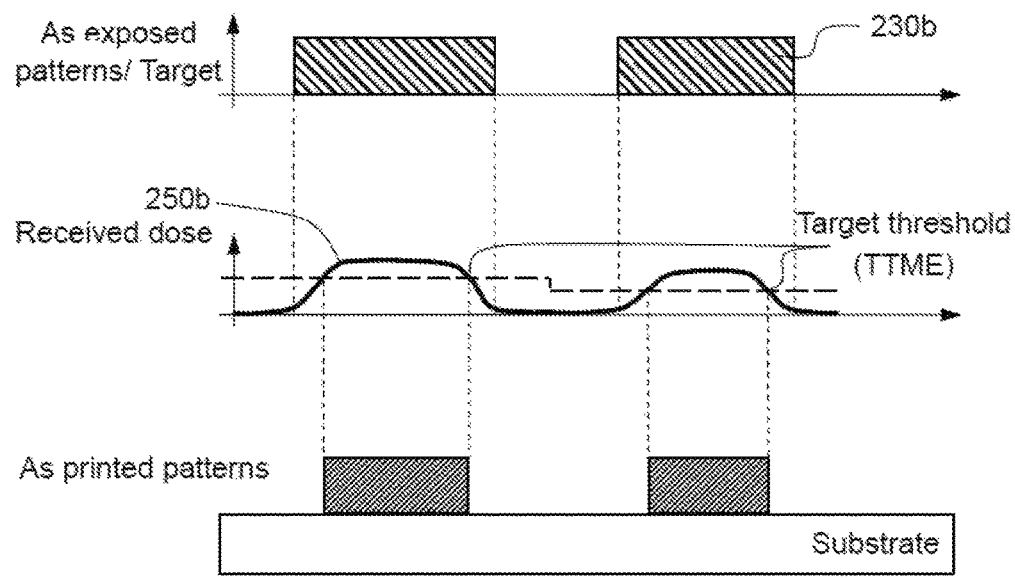

FIGS. 2a and 2b illustrate respectively a bias between the target/simulated patterns and the measured patterns, and a relationship between the measured pattern and Threshold To Meet Experiment (TTME) in a number of embodiments of the invention.

According to various embodiments of the invention, a calibration set comprising a plurality of patterns is selected. The patterns in the calibration set should be diverse enough in terms of size, space and density. The calibration set is used to capture the signature of the process in as many configurations as possible. Precision of the model will largely depend on the number and representativeness of patterns in the calibration set. Experimentally, the applicant has determined that a few hundred patterns yield a good precision. Typically, 800 patterns can be used, which is acceptable by industry standards. But the invention can also be implemented with a calibration set which includes a lower number of patterns. In this case, the precision of the model representing the process signature will be lower. Conversely, a calibration set which includes a higher number of patterns can be used. The precision will be higher, but the calibration workload will be more significant, and possibly not acceptable in a number of applications.

FIGS. 2a and 2b illustrate schematically the measurements and calculations which are performed during a calibration procedure according to the invention. Metrology results can be acquired at different steps of the manufacturing process: after insulation, after etching, after loading, etc.
. . . .

A mask or a wafer are represented on FIGS. 2a and 2b, with a substrate 220a. A exposure pattern 230b is cast onto the surface and creates an actual pattern 240a.

According to a first embodiment of the invention, illustrated on FIG. 2a, one can measure the difference 250a between the actual print 240a of a pattern and a target or simulated pattern 230a in a definite process. This difference or delta between target and exposure is often called bias. In this embodiment, the model can be calibrated as a full process model as discussed further down in the description in relation with FIG. 3a, or as a resist model only, to be used in conjunction with a PSF, as discussed further down in the description in relation with FIG. 3b. In the first case, the bias is calculated in relation to the target pattern. In the second case, it is calculated in relation to the pattern which is simulated using the PSF.

According to a second embodiment of the invention, illustrated on FIG. 2b, one can calculate a Threshold To Meet Experiment or TTME which is a dose (or energy) level 250b corresponding to the intersection of the measured print 240a with a dose curve 240b taken from a PSF model. Therefore, this modeling method can only be used in combination with a PSF model, as a resist model.

Figure 3B:
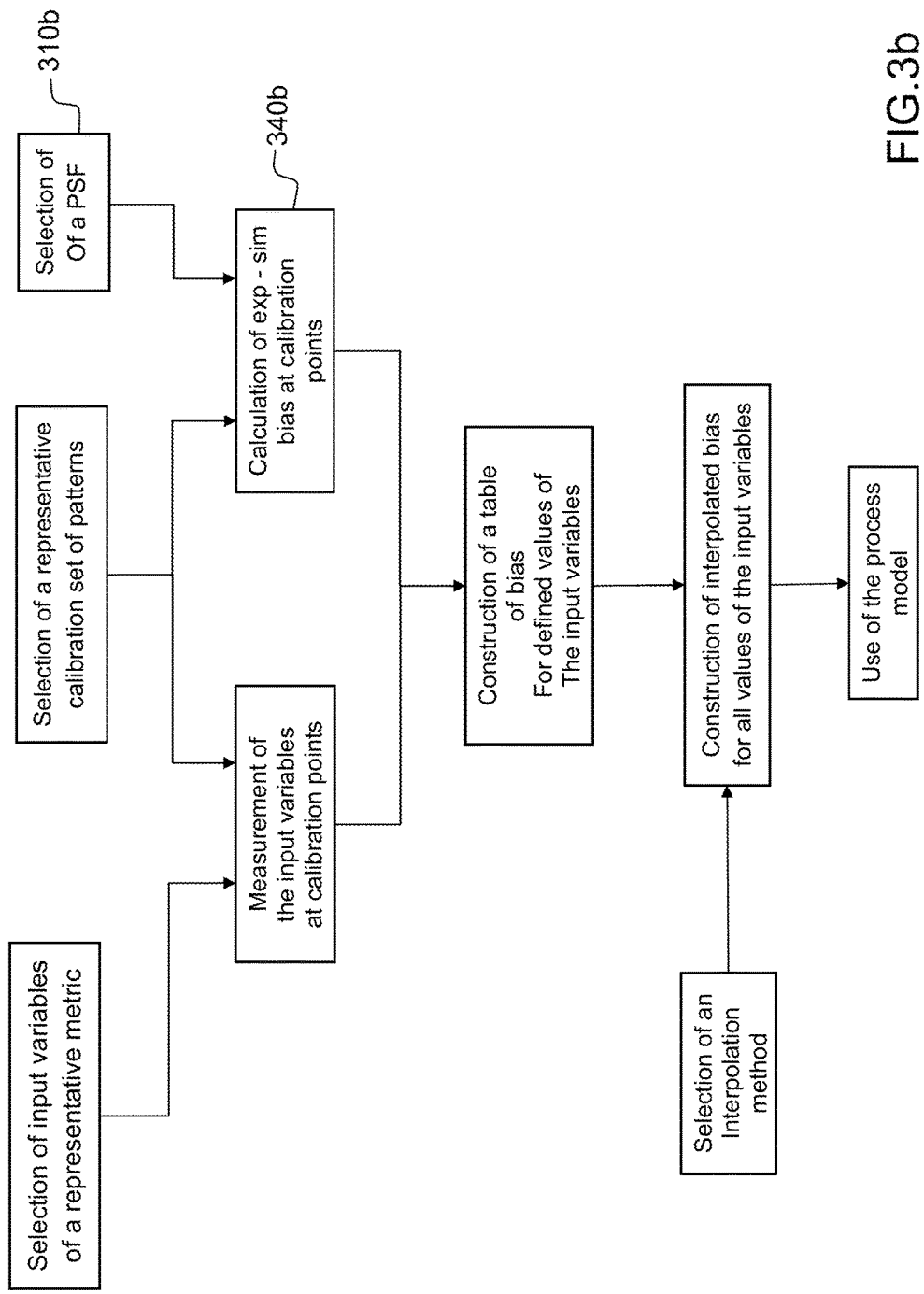
Figure 3C:
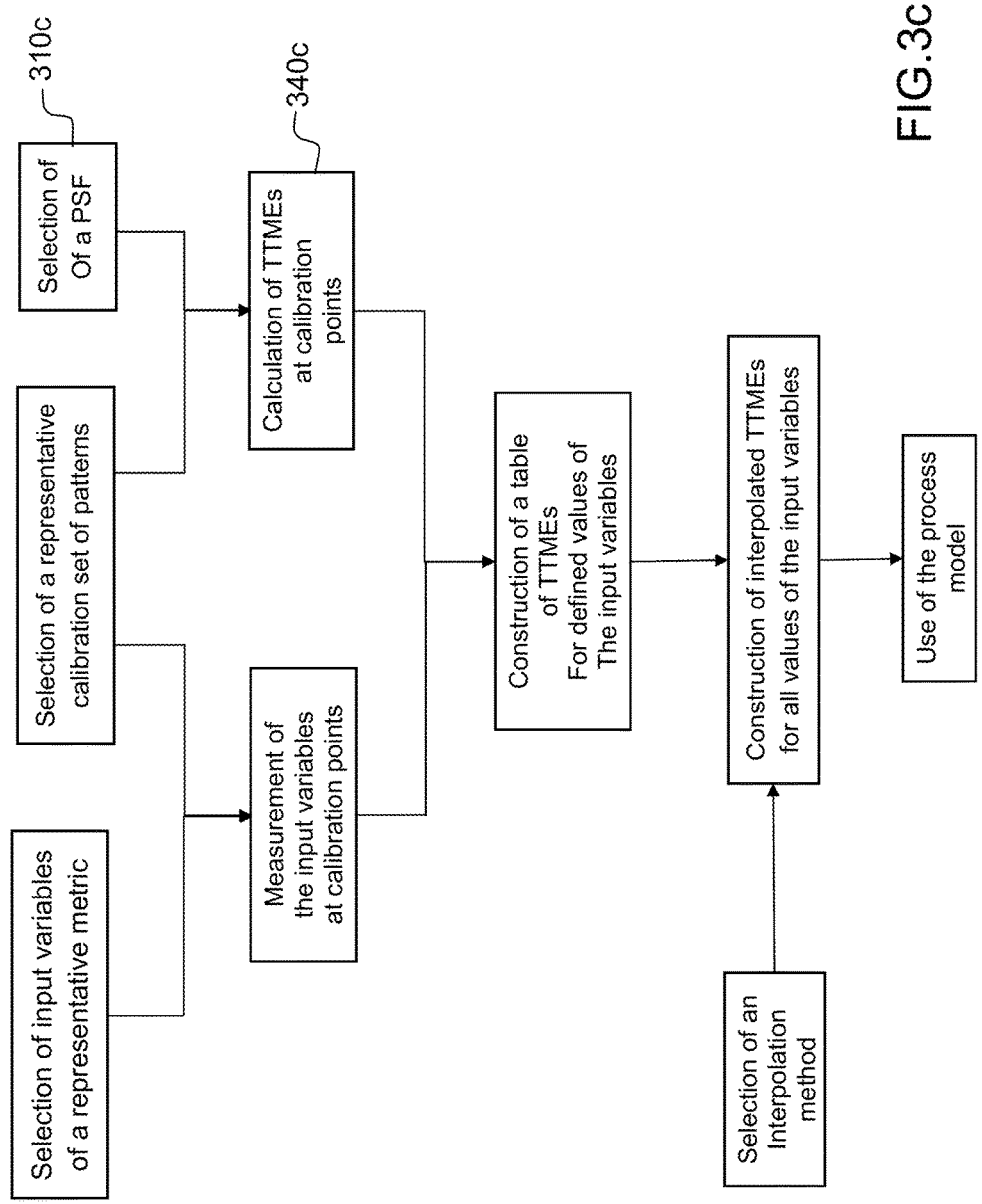

FIGS. 3a, 3b and 3c represent flow charts of variants of the process to build a process model according to a number of embodiments of the invention.

As already discussed, a process model according to the invention can be used to model all the effects of using e-beam lithography, etching, developing, etc. . . . , or only as a resist model, which will be used in combination with a PSF which models the electronic proximity effects.

FIG. 3a illustrates a flow chart of steps to implement the invention according to a first class of embodiments where all the effects are jointly modeled.

A calibration set of patterns is selected at step 310a as already discussed above. An adequate metric to identify the signature of the process on the calibration set of patterns is also selected at step 320a. Selection of an adequate metric is not the object of the present invention. Specific metrics which are advantageous to implement this invention have been disclosed by European patent application filed under no EP 14305834.5 which is co-assigned to the applicant of the present application. Specifics of these metrics are discussed below in relation to FIGS. 5a, 5b and 5c. Other types of metrics, such as some based on visibility kernels can also be used, without departing from the scope of the invention. Visibility kernels are for instance disclosed by Sato (S. Sato, K. Ozawa, and F. Uesawa, "Dry-etch proximity function for model-based OPC beyond 65-nm node", proc. SPIE vol 6155, 2006), or Park (J.-G. Park, S.-W. Kim, S.-B. Shim, S.-S. Suh, and H.-K. Oh, "The effective etch process proximity correction methodology for improving on chip CD variation in 20 nm node DRAM gate', Design for Manufacturability though Design-Process Integration V, proc. SPIE vol 7974, 2011). Also, US patent applications published under no US2010/269084 and US2011/138343 disclose visibility kernels to scan semiconductor designs.

A metric can be represented by a vector having a number of variables which will be used as input variables of the model. For instance, CD (i.e. Critical or Characteristic Dimension of the pattern, which is, in a pattern comprising lines, the width of a line), Space (which is in a pattern comprising lines, a distance between lines) or Density, which is a compound of CD and Space and can be calculated using various methods, for instance, by integration or convolution from points of interest along a scan radius.

It is advantageous to use enough input variables to be able to correctly account for the variance in the signature of the process. But including too many input variables in the metric will make the runtime longer.

At step 330a, the input variables are measured at selected calibration points (as discussed above). At step 340a, a calculation of a difference between the exposed pattern and the target pattern (or Bias) is performed, at the same points, as explained above in relation to FIG. 2a. A data normalization procedure is then performed at step 350a: the values of Bias corresponding to the same input vectors are averaged At step 370a, interpolated values of Bias for interpolated values of the input vector are calculated, using an interpolation method selected at step 360a. Various interpolation methods can be used to implement this step. For instance, a kriging interpolation procedure may be used. Kriging procedures are described at http://en.wikipedia.org/wiki/Kriging. Kriging or Gaussian process regression is a method of interpolation for which the interpolated values are modeled by a Gaussian process governed by prior covariances, as opposed to a piecewise-polynomial spline chosen to optimize smoothness of the fitted values. Under suitable assumptions on the priors, kriging gives the best linear unbiased prediction of the intermediate values. Interpolating methods based on other criteria such as smoothness need not yield the most likely intermediate values. The technique is also known as Kolmogorov Wiener prediction.

For using the model, at step 380a, we can build a functional relationship between the input variables and the output variable (the Bias or TTME). A functional relationship can be built, for example, by using a correlation function between the input variables and the output variable, as a man of ordinary skill can do. We can alternatively use a table where the interpolated values of the input variables and the averaged output variable are input. Even if a functional relationship is built, it will be more efficient, in terms of use of the computing resources, to convert the values obtained by the functional relationship into a table, which it will be possible to use instantaneously when using the model.

It will be noted that the validity domain of the model is defined by the domain in which the calibration step has been performed.

In a variant of the invention, illustrated on the flow chart of FIG. 3b, a step of selection of a PSF is performed, prior to the calibration and calculation steps. The PSF can be of the types described in relation to FIGS. 1a and 1b. In the case of electron lithography, it can be a combination of centered Gaussian functions, with parameters α and β which represent the forward scattering and backward scattering effects. The Gaussian function representing the back scattering effect can also be off-centered in relation to the center of the beam, as disclosed by EP2560187, cited above. Different types of functions can also be used, such as the one disclosed by European patent application published under no EP2650902 which is assigned to the same applicant as the applicant of this application, wherein diffusion functions of the Voigt type are used. Also, other modeling approaches of the electronic proximity effects can be used, such as the one disclosed by European patent application EP2756518, wherein a probabilistic approach for the deconvolution function is applied. In the case of optical lithography, it can be a sum of coherent sources or other similar models.

Then, in this variant of the invention, the step 340a is replaced by a step 340b, wherein, instead of calculating Bias as the difference between the insulated pattern and the target pattern, Bias is calculated as a difference between the insulated pattern and a simulated pattern which is obtained by convoluting the selected PSF with the target design patterns. The calculation of Bias is of the same type as the one explained in relation to FIG. 3a, except that the target pattern is replaced by the simulated pattern.

Then, the other steps are performed as described in the variant of FIG. 3a.

In another variant, illustrated on the flow chart of FIG. 3c, there is also a step of selection of a PSF, 310c, but the calculation of Bias of step 340b is replaced by a step, 340c, of calculation of a Threshold To Meet Experiment (TTME) of the type represented on FIG. 2b, which was explained in the part of the description above in relation with this FIG. 2b. The use of Bias implies geometry corrections, whereas the use of TTME is more adapted for dose corrections The other steps are performed like in the variants of FIGS. 3a and 3b.

FIGS. 4a and 4b represent tables with variables of a process model and corresponding values respectively of the TTME and the Bias in a number of embodiments of the invention.

The tables of FIGS. 4a and 4b are provided only as illustrations of two different implementations of the method of the invention. They are in no way limiting the scope of the claims, which apply to other results of the same type, with a different number of input variables, and different values. As already explained, there are different use cases for Bias and for TTME.

Figure 5A:
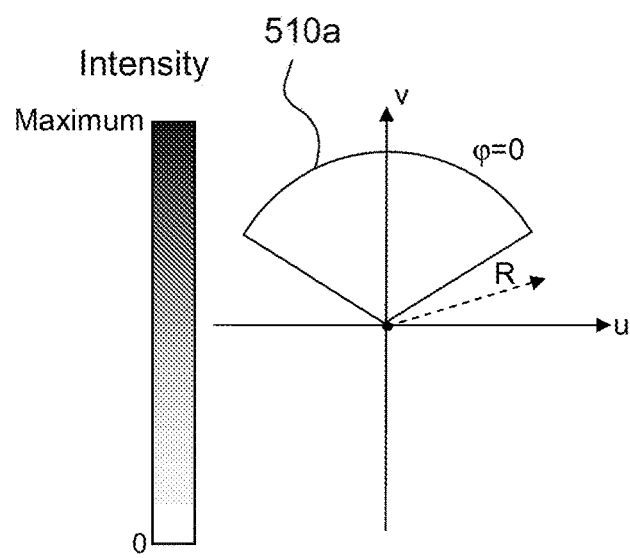
FIGS. 5a, 5b, and 5c illustrate an example of a metric used in a process model according to a number of embodiments of the invention.
Figure 5B:
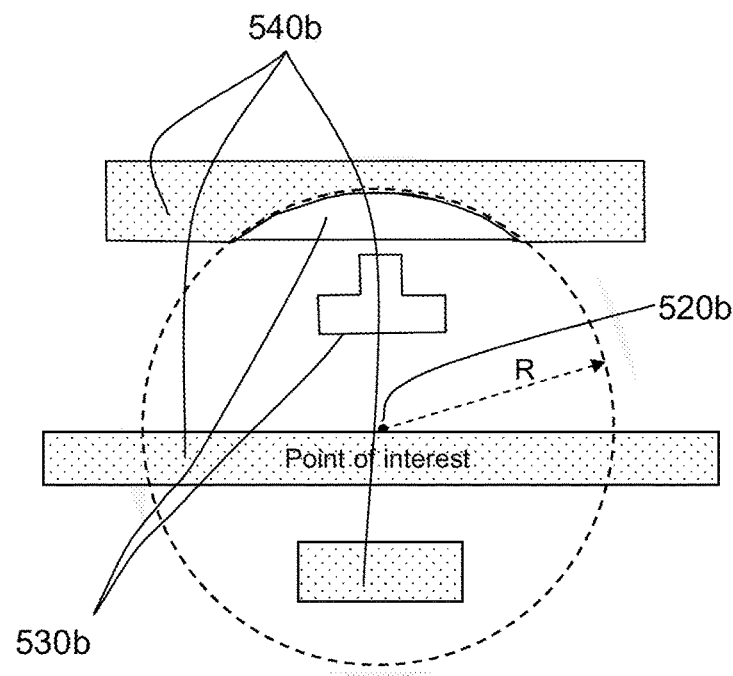
Figure 5C:
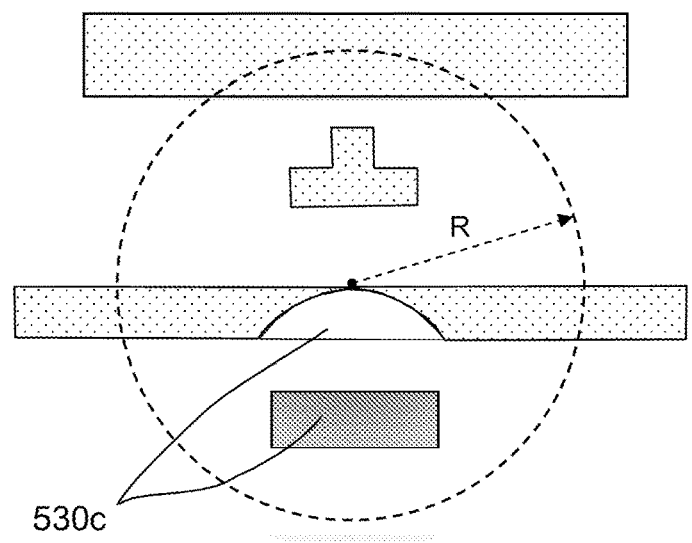

FIGS. 5a, 5b and 5c illustrate an example of a metric used in a process model according to a number of embodiments of the invention.

The metrics illustrated on these figures are of a type disclosed by European patent application filed under no EP14305834.5 which is co-assigned to the applicant of the present application.

FIG. 5a illustrates an anisotropic area of interest 510a, which has a radius R, and a deformation angle θ.

FIG. 5b illustrates an intersection 530b of the area under computation 510a from a point of interest 520b with a set of target patterns 540b. In this case, according to the invention, the computation extends across the whole area under computation, even though some areas are not visible from the point of interest. The result of the computation is used, as explained below to define an External Density.

FIG. 5c illustrates an intersection 530c of the area under computation 510a rotated by the angle φ=π from a point of interest 520b with a set of target patterns 540b. In this case, according to the invention, the computation extends across the whole area under computation, even though some areas are not visible from the point of interest. The result of the computation is used, as explained below to define an Internal Density.

The External Density and the Internal Density are computed as a convolution denoted by *, across the whole target design. For each point of interest (x,y), one computes a product of convolution V(x,y) of the target design, represented by a function, L(x,y) with an oriented kernel, N(x,y) as:

$$V(x,y)=L(x,y)*N(x,y)$$

The convolution product calculation is given by:

$$V(x, y) = \int_{-\infty}^{+\infty}\int_{-\infty}^{+\infty} L(u, v) \cdot N(x - u, y - v) \cdot du \cdot dv \quad [\text{Eq. 1}]$$

Where the oriented kernel N(u,v) can be split into two contributions:

$$N(u,v)=K(\sqrt{u^2+v^2})\cdot f(a\, \tan(v/u)+\varphi)$$

With:

$K(\sqrt{u^2+v^2})$ is the Gaussian kernel function, and $f(a\tan(v/u)+\varphi)$ is a deformation function.

The φ angle is the shift angle of deformation function which varies according to the location (x,y) on the design.

The φ angle has as reference, the axis for which the basis deformation function reaches its maximum. The shift angle may vary in the range [0, 2π]. Notice that φ angle has only one possible value for (x,y) location. Thus, it can be considered as constant parameter for each V(x,y) calculation.

For convenience, in the following part of the description, the N(u,v) function will be written in polar coordinates as:

$$N(r,\theta)=K(r)\cdot f(\theta+\varphi)$$

Where the radius $r=\sqrt{u^2+v^2}$, and θ=a tan(v/u).

In the case of a calculation of an External Density, f(θ+φ) is configured so that the kernel is oriented towards the outside of the pattern. Indeed if φ is replaced by φ+π, the Internal Density can be computed in parallel with External Density without further cost of calculation.

Likewise, in the case of a calculation of an Internal Density, f(θ+φ) is configured so that the kernel is oriented towards the inside of the design. Indeed if φ is replaced by φ+π, the External Density can be computed in parallel with Internal Density without further cost of calculation.

The shift angle φ is selected as the angle of view from the point of interest to the vertical axis on the design pattern which maximizes the sensitivity of the product of convolution to the estimated metrics (Space or CD). In the case of a Manhattan patterned design (i.e. with perpendicular lines), the adequate shift angle will be π/2 (3π/2) or 3π/2 (π/2), when the point of interest is on the right (left) edge of a vertical line and the observation is respectively to the outside or the inside of the design. When the point of interest is on the bottom (top) edge of a horizontal line of a Manhattan patterned design, the adequate shift angle will be π (zero) or zero (π), when the observation is respectively to the outside or the inside of the design.

More generally, a preferred rule is that the shift angle φ of the deformation function is selected as being optimal for the area of the patterned design (Manhattan or free-form, for instance). When moving the point of interest along an edge of a patterned design, in an area where the normal to the edge can be defined (i.e. the tangent to the edge is continuous), φ is defined as the angle of the normal to the edge to the direction of reference.

At a point of discontinuity, in a preferred embodiment, the shift angle can be defined as the angle between the bisector of the external angle of the two segments at the point of discontinuity and the direction of reference.

The method of the invention may be used in many use cases in the manufacturing process of semiconductor ICs. More specifically, it is well suited for certain types of e-beam lithography processes to replace a method wherein the proximity effect corrections are calculated through a simulation which is decomposed in a first step wherein a convolution between a Point Spread Function (PSF) and the design is calculated and a second step wherein the resist threshold is taken into account.

The more precise global or partial (i.e. including or not a PSF) process model of the invention, which can be adjusted to any type of process signature is very efficient. This is especially the case to model e-beam lithography processes after etching and/or when extreme ultra-violet (EUV) masks are used. This is because extreme UV are covered by a heavy metal layer (Tantalum or tantalum nitride) which creates significant back-scattering effects.

This is also the case whenever a more precise model of the process is needed, for direct write, simulation or inspection applications.

The method of the invention can be implemented with any type of lithography equipment, simulation or inspection device, for instance by controlling the equipment or device with an Inscale™ software incorporating computer code instructions configured for performing the steps disclosed in this description.

The examples disclosed in this specification are only illustrative of some embodiments of the invention. They do not in any manner limit the scope of said invention which is defined by the appended claims.

The invention claimed is:

1. A computer-implemented method of determining, with a computer, a process model for manufacturing a semiconductor integrated circuit defined by a target design to be printed on a substrate, said method comprising:
- processing the target design to be printed on the substrate;
- selecting a calibration set comprising a plurality of patterns stored in a memory of the computer;
- convoluting a compound of a kernel function and a deformation function with the target design, wherein the convoluting comprises selecting a shift angle for the deformation function;
- determining at least an input variable representative of a variance in features of said plurality of patterns;
- printing the plurality of patterns of the calibration set on the substrate;
- measuring a series of values of the at least an input variable by determining a first series of values of the at least an input variable at a number of points on the plurality of patterns;
- measuring, at the number of points, a second series of values of an output variable representative of the printed of patterns of the calibration set; and
- determining the process model as being one of a functional and associative relationship between the first series of values of the at least an input variable and the second series of values of the output variable.

2. The method of claim 1, wherein said relationship is extended to the target design by an interpolation procedure.

3. The method of claim 2, wherein the interpolation procedure is a kriging procedure.

4. The method of claim 3, wherein the kriging procedure has a step which is defined as a function of the tolerance of the corrections to be applied to the target design.

5. The method of claim 1, wherein the at least an input variable is representative of one of CD, Space and density of patterns in the target design.

6. The method of claim 1, wherein the number of points on the plurality of patterns are located on the edges of said patterns.

7. The method of claim 1, wherein the output variable is a dimensional bias between target patterns in the calibration set and the actual printed patterns.

8. The method of claim 1, wherein the output variable is a dimensional bias between the actual printed patterns in the calibration set and the aerial image of a simulated design obtained by convolution of the target patterns in the calibration set with a PSF.

9. The method of claim 1, wherein the output variable is a Threshold To Meet Experiments (TTME) representative of a received dose defined by a PSF to create an aerial image of patterns in the calibration set.

10. The method of claim 9, wherein the TTME is determined at one of after exposure and after etching.

11. The method of claim 1, wherein series of values of the output variables obtained for same values of the at least an input variable are merged by a weighted average procedure.

12. A method of claim 1, further comprising:
- selecting in a memory of a computer a process model in a list of candidate process models based on a list of features characterizing at least one of the target design, the resist and the substrate;
- retrieving from the memory of the computer one of a functional and associative relationship between values of at least an input variable and values of an output variable characterizing the selected process model;
- calculating values of the at least an input variable at loci on the target design;
- getting from the model values of the output variable for the at least an input variable at the loci;
- storing the values of the output variable at the loci for use in one of a correction step, a simulation step and an inspection step of the IC manufacturing process;

said method wherein the at least an input variable is determined by convoluting a compound of a kernel function and a deformation function with the target design, said deformation function comprising a selected shift angle.

13. A computer program for determining a process model for manufacturing a semiconductor integrated circuit defined by a target design to be printed on a substrate, said computer program comprising:
- one or more interfaces for:
  - processing the target design to be printed on the substrate;
  - selecting a calibration set comprising a plurality of patterns stored in a memory of a computer;
  - convoluting a compound of a kernel function and a deformation function with the target design, wherein the convoluting comprises selecting a shift angle for the deformation function;
  - determining at least an input variable representative of a variance in features of said plurality of patterns;
  - printing the plurality of patterns of the calibration set on the substrate; and
  - measuring a series of values of the at least an input variable by determining a first series of the at least an input variable at a number of points on the plurality of patterns;
- computer code configured for measuring, at the number of points, a second series of values of an output variable representative of the printed patterns of the calibration set; and
- computer code configured for determining the process model as being one of a functional and associative relationship between the first series of values of the at least an input variable and the second series of values of the output variable.

14. A computer program of claim 13, further comprising:
- one or more interfaces for:
  - selecting in a memory of a computer a process model in a list of candidate process models based on a list of features characterizing at least one of the target design, the resist and the substrate; and
  - retrieving from the memory of the computer one of a functional and associative relationship between values of at least an input variable and values of an output variable characterizing the selected process model; and
- computer code configured for:
  - calculating values of the at least an input variable at loci on the target design;
  - getting from the model values of the output variable for the at least an input variable at the loci; and
  - storing the values of the output variable at the loci for use in one of a correction step, a simulation step and an inspection step of the IC manufacturing process;
  - said computer program wherein the at least an input variable is determined by convoluting a compound of a kernel function and a deformation function with the target design, said deformation function comprising a selected shift angle.

15. A semiconductor manufacturing equipment configured to use at least an output of a computer program according to claim 13, said semiconductor manufacturing equipment configured for one of direct writing on semiconductor wafers, writing on a mask plate, etching, chemically or mechanically planarizing, or baking, annealing a semiconductor wafer, and inspecting a mask or semiconductor surface.

\* \* \* \* \*